United States Patent [19]

Kawachi et al.

[11] Patent Number: 5,008,218
[45] Date of Patent: Apr. 16, 1991

[54] METHOD FOR FABRICATING A THIN FILM TRANSISTOR USING A SILICIDE AS AN ETCH MASK

[75] Inventors: Genshiro Kawachi, Hitachi; Akio Mimura, Katsuta; Nobutake Konishi, Hitachiota; Kikuo Ono; Takashi Suzuki, both of Hitachi, all of Japan

[73] Assignee: Hitachi, Ltd., Tokyo, Japan

[21] Appl. No.: 408,729

[22] Filed: Sep. 18, 1989

[30] Foreign Application Priority Data

Sep. 20, 1988 [JP] Japan ................. 63-233425

[51] Int. Cl.$^5$ .................................. H01L 21/44
[52] U.S. Cl. ...................... 437/201; 437/200; 437/228; 148/DIG. 105; 148/DIG. 106
[58] Field of Search ............ 437/200 US, 201; 148/DIG. 105, DIG. 106

[56] References Cited

U.S. PATENT DOCUMENTS

| 4,285,761 | 8/1981 | Fatula, Jr. et al. | 437/200 |
| 4,362,597 | 12/1982 | Fraser et al. | 437/193 |
| 4,444,617 | 4/1984 | Whitcomb | 156/646 |
| 4,470,189 | 9/1984 | Roberts et al. | 437/193 |
| 4,726,879 | 2/1988 | Bondur et al. | 437/233 |
| 4,753,709 | 6/1988 | Welch et al. | 437/200 |

FOREIGN PATENT DOCUMENTS 61-229365 10/1986 Japan .
61-231765 10/1986 Japan .
61-278163 12/1986 Japan .
62-120354 7/1987 Japan .

Primary Examiner—Brian E. Hearn
Assistant Examiner—Laura M. Holtzman
Attorney, Agent, or Firm—Antonelli, Terry, Stout & Kraus

[57] ABSTRACT

A method for fabricating an active matrix substrate is disclosed which includes the following steps: forming an island region of a first semiconductor film on a prescribed insulating substrate; forming a first insulating film and a second semiconductor film on said first insulating film; forming a second insulating film on said second semiconductor film and thereafter forming a prescribed pattern of the second insulating film; depositing prescribed metal on the pattern and thereafter forming a compound of the second semiconductor film and the metal; removing unreacted portion of the metal; and etching said second semiconductor film and said first insulating film using said compound as a mask.

14 Claims, 8 Drawing Sheets

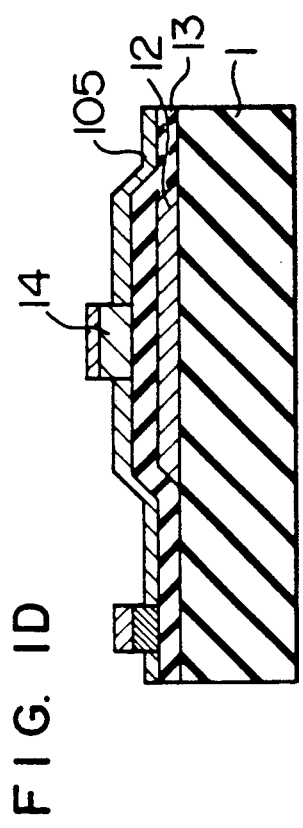
FIG. IA
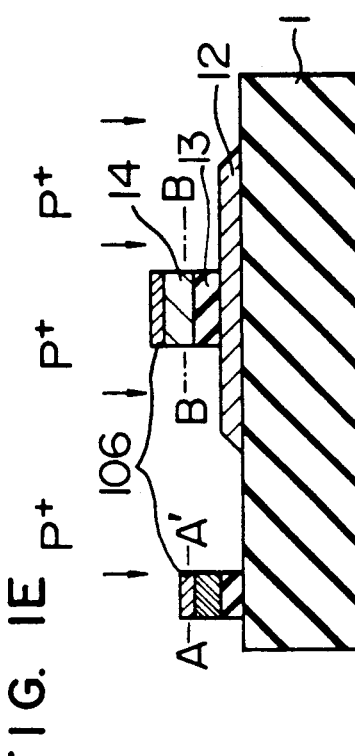
FIG. IB
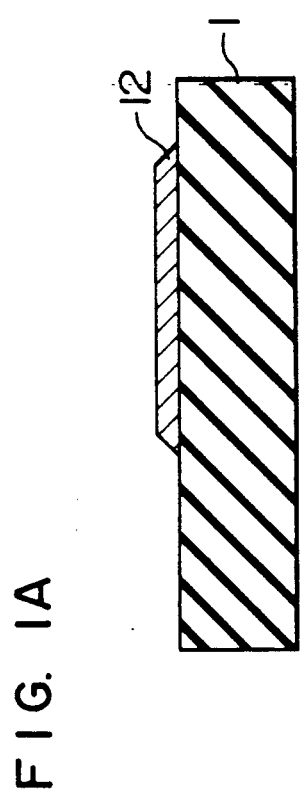
FIG. IC
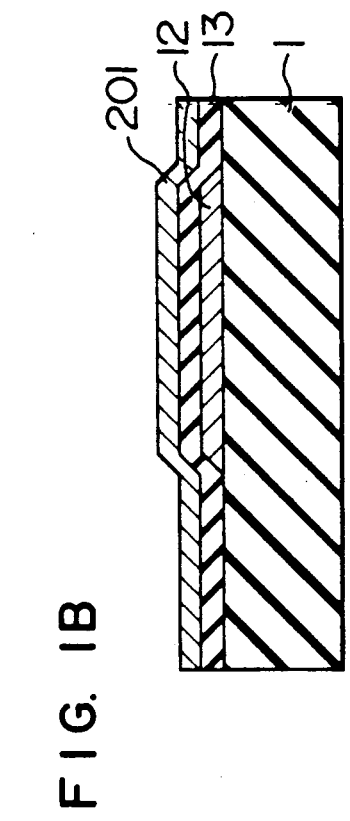
FIG. ID
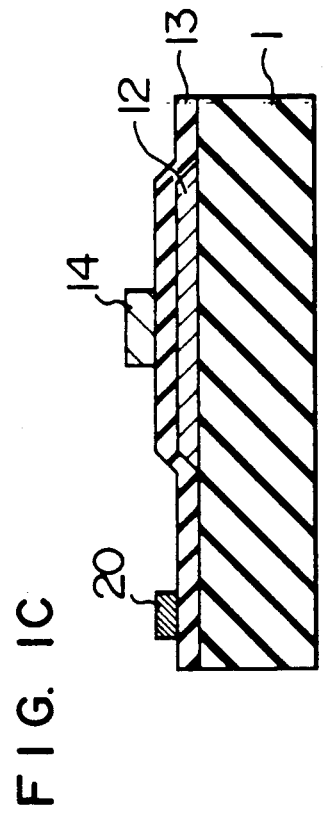
FIG. IE
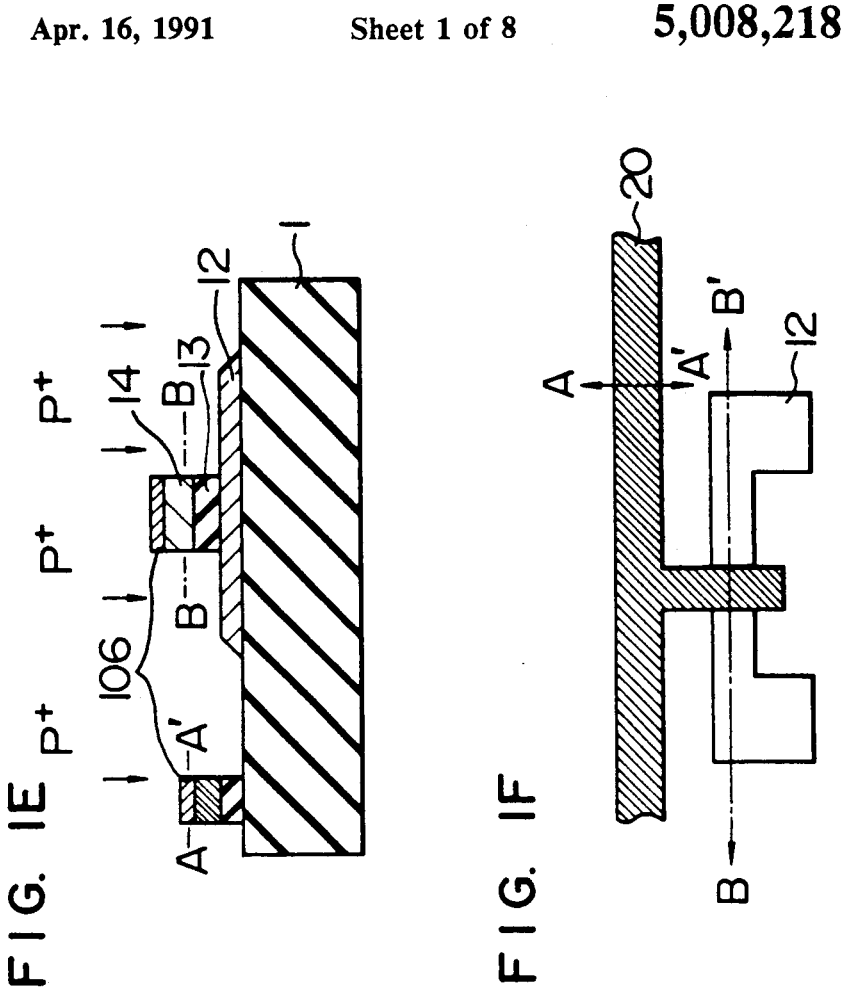
FIG. IF F I G. 2A 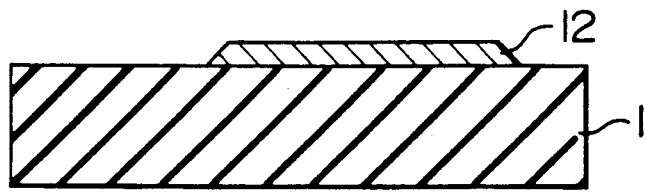
F I G. 2B 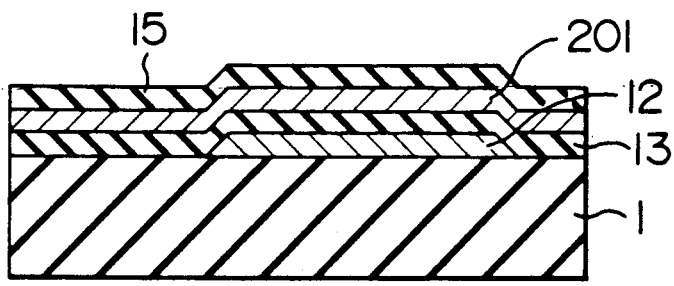
F I G. 2C 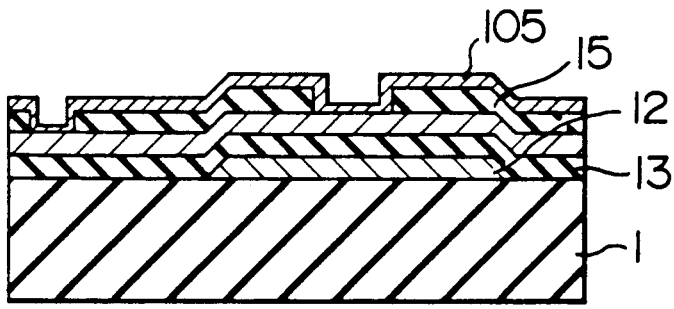
F I G. 2D 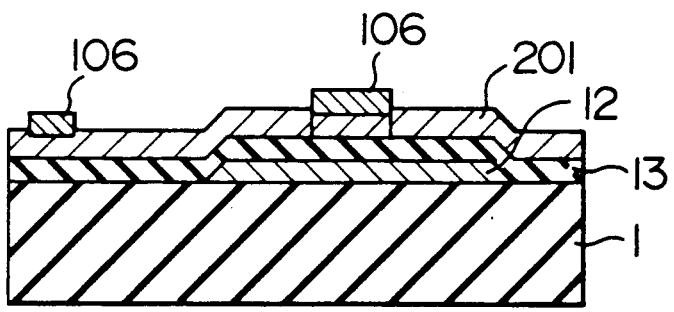

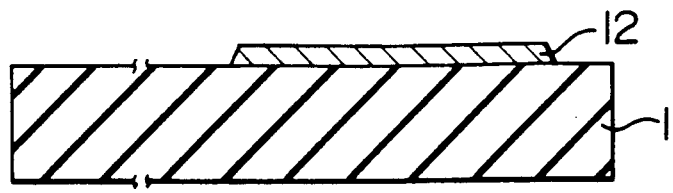
F I G. 3A
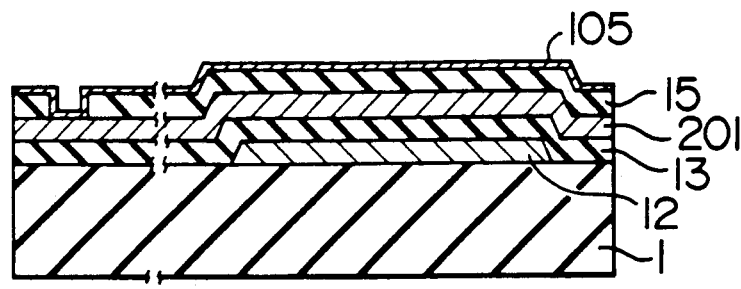
F I G. 3B
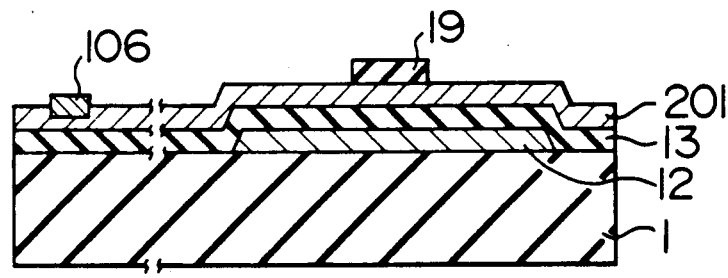
F I G. 3C
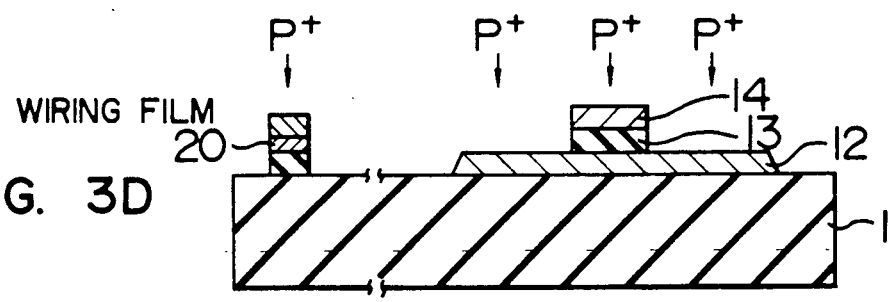
F I G. 3D
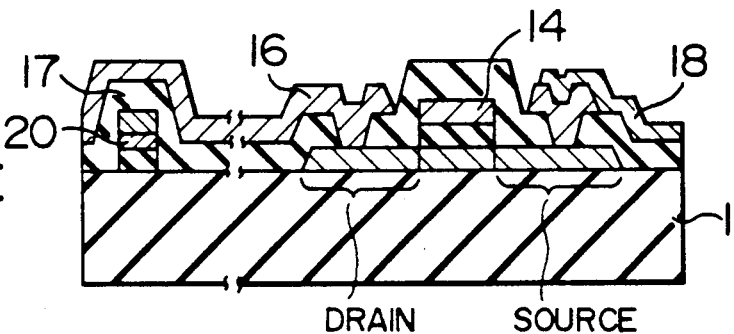
F I G. 3E
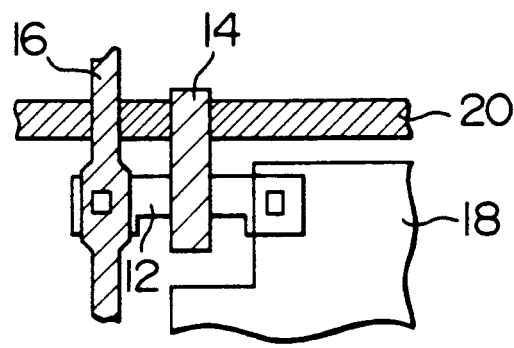
F I G. 3F

METHOD FOR FABRICATING A THIN FILM TRANSISTOR USING A SILICIDE AS AN ETCH MASK

BACKGROUND OF THE INVENTION

The present invention relates to an active matrix substrate and a method for fabricating it, and more particularly to an active matrix substrate suited for a display device and a method for fabricating it. The active matrix substrate is a substrate which includes switching elements on the crossings of the matrix.

Electronic apparatus having a thin film semiconductor device such as an active matrix substrate, in which thin film transistors (TFT's) or the like are formed on an insulating substrate (e.g. glass), have important technical problems such as improvement of image quality (improvement of aperture of pixels) and ease of fabrication, with the development of high definition of images. In order to solve these technical problems, there have been proposed several contrivances. Examples of the proposals relative to the active matrix substrate are disclosed in JP-A-61-229365, JP-A-61-231765, JP-A-61-278163, and JUM-A-62-120354.

Rough explanation will be given for the method for fabricating an active matrix disclosed in these references and problems relative thereto. First, after a Poly-Si film, which serves as an active layer of the TFT having a MOSFET structure, has been formed, an $SiO_2$ film constituting a gate insulating film and a Poly-Si film constituting a gate electrode are successively deposited thereon. The Poly-Si film for a gate electrode and the $SiO_2$ film for a gate insulating film will be subjected to photoetching. More specifically, they are patterned using photoresist as a mask. After the photoresist has been removed, platinum (Pt) is deposited on the entire surface of the structure. The structure is then heat-treated to form a Pt silicide layer. The unreacted platinum is removed using aqua regia.

In this case, the following problems will be involved. The Pt silicide layer will be formed on the surface of the Poly-Si layer for a gate electrode to thereby realize low resistance of the Poly-Si layer, but the surface of the Poly-Si layer serving as an active layer (including source and drain regions of MOSFET as well as a channel region thereof) will be silicided. Thus, source and drain electrodes connected with the source and drain regions will provide Schottky junctions, which makes it difficult to obtain a TFT with an improved characteristic. As a result, a redundant step is required to remove the silicide layer from the source and drain regions, and it is difficult to completely remove this silicide layer. Moreover, if the Poly-Si film for an active layer is made thin in order to prevent the characteristic of the TFT from being greatly varied during irradiation of light, the Poly-Si film will exfoliate due to the presence of the silicide formed thereon.

SUMMARY OF THE INVENTION

An object of the invention is to provide an active matrix substrate having a TFT with improved characteristics and a method for fabricating it.

Another object of the present invention is to provide an active matrix substrate, when constructed as a display device, which can improve image quality, and a method for fabricating it.

Still another object of the present invention is to provide an active matrix substrate structure free from film exfoliation and a method for fabricating it.

In order to attain the above objects, in accordance with one aspect of the present invention, there is provided a method for fabricating an active matrix comprising the steps of (1) forming an island region of a first semiconductor film on a prescribed insulating substrate, (2) forming a prescribed pattern layer of a second semiconductor film through a first insulating film, (3) depositing prescribed metal of the pattern and thereafter forming a compound of the second semiconductor film and the metal, (4) removing unreacted portions of the metal, and (5) etching the first insulating film using the compound as a mask.

In accordance with another aspect of the present invention, there is provided, as a display device, an active matrix substrate comprising an island region of a first semiconductor film formed on a prescribed insulating substrate; and a laminated film consisting of a first insulating film, a second semiconductor film and a compound of the second semiconductor film and predetermined metal, one end of which intersects the island region and the other end of which extends outside the island region, the intersecting portion constituting an active layer of a transistor; and source and drain electrodes kept in ohmic contact with part of the island region other than the active layer, the extending portion of the laminated layer constituting wirings.

In accordance with a still another aspect of the present invention, there is provided an active matrix substrate structure in which the source and drain regions of TFT are not entirely covered, in their surface, with silicide, and a method for fabricating this structure.

BRIEF DESCRIPTION OF THE DRAWINGS

The present invention will be more apparent from the following detailed description, when taken in conjunction with the accompanying drawings, in which:

FIGS. 1A to 1E are sectional views showing the process for fabricating an active matrix substrate in accordance with one embodiment of the present invention;

FIG. 1F is a plan view showing the planar pattern of FIG. 1E;

FIG. 2A to 2F are sectional views showing the process for fabricating an active matrix device in accordance with a second embodiment of the present invention;

FIGS. 3A to 3E are sectional views showing the process for fabricating an active matrix substrate in accordance with a third embodiment of the present invention;

FIG. 3F is a plan view showing the planar pattern of FIG. 3E;

DESCRIPTION OF THE PREFERRED EMBODIMENTS

Figure 2E:
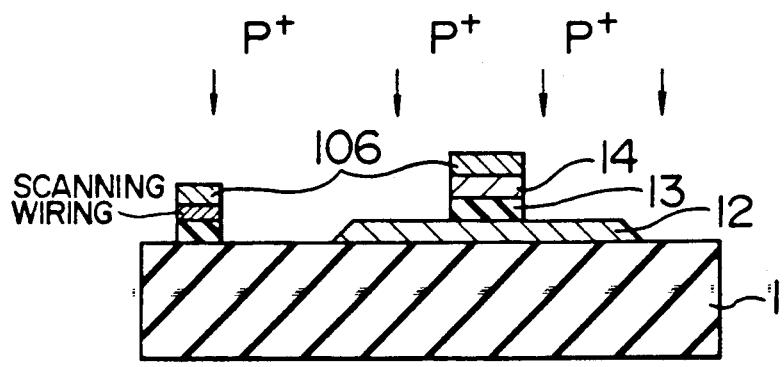

Prior to explaining several embodiments of the present invention, the general operation or function of the present invention will be explained.

In the case where source and drain regions of a thin film transistor (TFT) to be formed on an insulating substrate are to be formed by ion implantation, it is necessary to form a gap layer (e.g. $SiO_2$ film) which covers the source and drain regions since the Poly-Si film as an active layer is comparatively thin. If the gap layer is not present, it will be difficult to adjust the impurity concentration in the source and drain regions, which makes it impossible to provide a TFT with desired characteristics. This gap layer to be removed after the completion of ion implantation will be removed using, as a mask, a silicide layer formed for realizing low resistance on the surface of the Poly-Si layer as a gate electrode. Thus, it can be removed in a self-aligned manner so that fine processing of the TFT can be made. As a result, the numerical aperture in the active matrix substrate can be improved due to reduction of the area required for TFT's and extension of the pixel electrode part.

Also the provision of a compound of the Poly-Si film and metal will make it unnecessary to provide contact through-holes at the junction between the source of the TFT and a signal electrode and at the junction between the gate of the TFT and a scanning electrode, which also leads to an improvement on the numerical aperture. Further, a major part of the Poly-Si film as an active layer is not covered with silicide in order to prevent Schottky junctions from being formed on the source and drain regions of the TFT so that exfoliation of the Poly-Si film can be prevented.

Embodiment 1

Now referring to FIGS. 1A to 1F, a first embodiment of the present invention will be explained.

A Poly-Si film 12 serving as an active layer of a thin film transistor (TFT) (first semiconductor film) is deposited on an insulating substrate 1 of glass by low pressure chemical vapor deposition (LPCVD) and is island-shape patterned to constitute a device region of TFT (FIG. 1A).

An $SiO_2$ film 13 serving as a gate insulating film of TFT (first insulating film) is deposited on the entire surface of the insulating substrate 1 by atmospheric pressure chemical vapor deposition (APCVD), and a Poly-Si film 201 constituting a gate electrode and wiring layer of the TFT (second semiconductor film) is further deposited on the entire surface by LPCVD (FIG. 1B).

The Poly-Si film 201 is patterned to constitute the areas for a scanning wiring 20 and a gate Si electrode 14 by photo-etching (FIG. 1C).

A Pt film 105 (refractory metal film) is further deposited on the entire surface by sputtering (FIG. 1D).

The resultant structure is heat-treated in an $O_2$ ambient for thirty minutes at 480° C. thereby to selectively silicify the areas 106 of the Pt film 105 which are in contact with the Poly-Si areas 14 and 20. An unreacted portion of the Pt film 105 is removed using aqua regia. P+ ions are implanted by ion-implantation using as a mask the selectively formed Pt silicide film (compound) 106, thereby forming source/drain regions and a scanning wiring (FIG. 1E). Although not shown, the side wall of the gate Poly-Si electrode is also silicided.

FIG. 1E shows a partial sectional structure of the semiconductor device in this embodiment whereas FIG. 1F shows the planar structure thereof. In FIG. 1E, the Poly-Si layer 12 as an active layer has the planar structure as shown. A stacked layer of the Poly-Si film and the Pt silicide film which is extended from the scanning wiring 20 intersects the Poly-Si film 20 through the gate $SiO_2$ film 13. Incidentally, the sectional lines AA' and BB' corresponds to AA' and BB' in FIG. 1F. Additionally, a quartz plate or the like may be used as the insulating substrate 1. Further, although in this embodiment the active layer 12 (Poly-Si film) was directly formed on the insulating substrate 1, it may be formed through an $SiO_2$ film or the like so that the diffusion of impurities from the insulating substrate 1 can be prevented.

Embodiment 2

Referring to FIGS. 2a to 2g, a second embodiment of the present invention will be explained.

A Poly-Si film 12 serving as an active layer of a thin film transistor (TFT) (first semiconductor film) is deposited on an insulating substrate 1 of glass by low pressure chemical vapor deposition (LPCVD) and is island-shape patterned to constitute a device region of the TFT (FIG. 2A).

An $SiO_2$ film 13 serving as a gate insulating film of the TFT (first insulating film) is deposited on the entire surface of the insulating substrate 1 by atmospheric pressure chemical vapor deposition (APCVD), and a Poly-Si film 201 constituting a gate electrode and wiring layer of the TFT (second semiconductor film) and a mask $SiO_2$ film 15 (second insulating film) are further deposited successively on the entire surface by LPCVD and APCVD, respectively (FIG. 2B).

As shown in FIG. 2C, the mask $SiO_2$ film 15 is selectively etched to reach the Poly-Si film 201 so as to pattern the areas for a wiring film 20 and a gate electrode film. After this patterning, a Pt film 105 is deposited on the entire surface by sputtering.

The resultant structure is heat-treated in an $O_2$ ambient for thirty minutes at 480° C. thereby to selectively silicify the areas 106 of the Pt film 105 which are in contact with the Poly-Si areas. An unreacted portion of the Pt film 105 is removed using aqua regia.

The Poly-Si film 201 and the gate $SiO_2$ film 13 are dry-etched using as a mask the selectively formed Pt silicide film (compound) and thereafter P+ ions are implanted by ion-implantation. The structure is heat-treated for one hour at 600° C. to form source/drain regions and a scanning wiring (FIG. 2E).

Figure 2F:
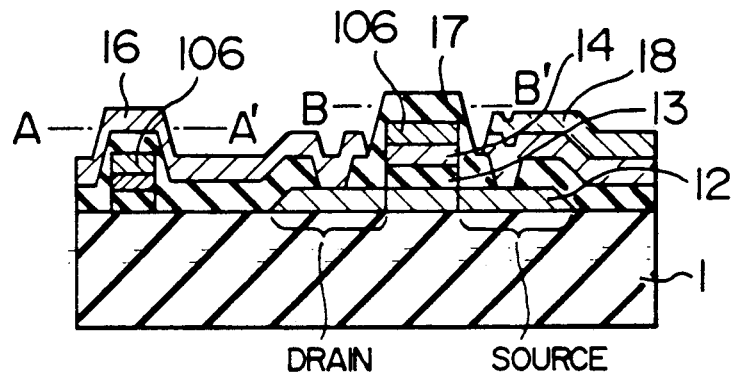

As shown in FIG. 2F, an interlayer insulating layer 17 is deposited by APCVD, and a contact through-hole for an aluminum wiring is made. An aluminum film is deposited and patterned by sputtering and to form an aluminum wiring 16. Further, a transparent film (Indium-Tin-Oxide) is deposited and patterned by sputtering to form a pixel electrode 18. Thus, an active matrix substrate in accordance with this embodiment is completed.

Figure 2G:
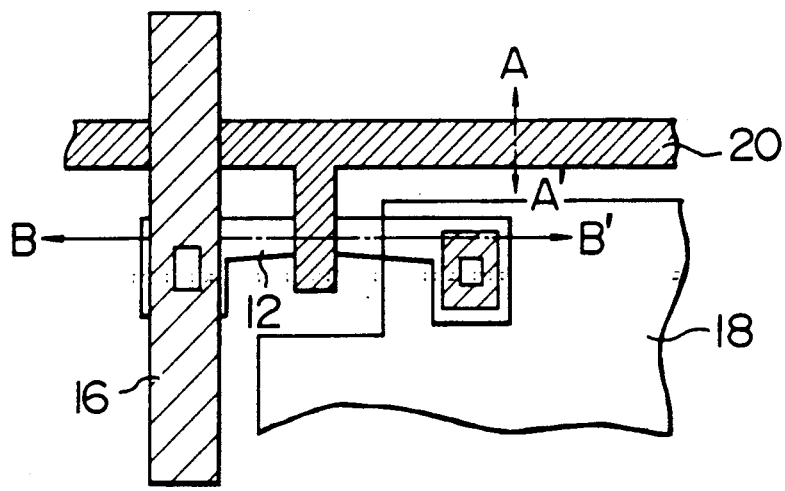
FIG. 2G is a plan view of the planar pattern of FIG. 2F.

FIG. 2G shows the planar structure of FIG. 2F. In FIG. 2G, lines AA' and BB' correspond to those in FIG. 2F.

Although in this embodiment, P+ ions were used as impurity ions, other ions may be implanted and heat-treated at 900° C.

In Embodiments 1 and 2, the Pt silicide film 106 was formed prior to patterning the gate Poly-Si film so that there is little extension of the Pt silicide film to the side wall of the gate Poly-Si film. This is effective to prevent the increase of the parasitic capacitor.

Embodiment 3

Referring to FIGS. 3A to 3F, a third embodiment of the present invention will be explained.

A Poly-Si film 12 serving as an active layer of a thin film transistor (TFT) (first semiconductor film) is deposited on an insulating substrate 1 of glass by low pressure chemical vapor deposition (LPCVD) and is island-shape patterned to constitute a device region of the TFT (FIG. 3A).

An SiO2 film 13 serving as a gate insulating film of the TFT (first insulating film) is deposited on the entire surface of the insulating substrate 1 by atmospheric pressure chemical vapor deposition (APCVD), and a Poly-Si film 201 constituting a gate electrode and wiring layer of the TFT (second semiconductor film) and a mask SiO2 film 15 (second insulating film) are further deposited successively on the entire surface by LPCVD and APCVD, respectively. Thereafter, a part of the mask SiO2 film 15, which is to be a wiring film 20, is removed to reach the Poly-Si film 201, and a Pt film 105 of refractory metal is deposited on the entire surface (FIG. 3B).

The resultant structure is neat-treated for thirty minutes at 480° C. to selectively silicify the Poly-Si film 201 at the area with the mask SiO2 film 15 removed, thus forming a Pt silicide film 106. Further, a photoresist film 19 is patterned for the purpose of machining the Poly-Si film 201 to provide a gate Si electrode 14 (FIG. 3C).

Using as a mask the Pt silicide film 106 and the photoresist 19, the Poly-Si film 201 is completely removed by dry-etching using CF4 gas and the gate SiO2 film 13 is also completely removed by dry-etching using CHF3 gas Thereafter, P+ions are implanted by ion implantation and the structure is heat-treated for one hour at 600° C. (FIG. 3D).

As shown in FIG. 3E, an interlayer insulating layer 17 is deposited by APCVD, and a contact through-hole for an aluminum wiring is made. An aluminum film is deposited and patterned by sputtering and to form an aluminum wiring 16. Further, a transparent film is deposited and patterned by sputtering to form a pixel electrode 18. Thus, an active matrix substrate in accordance with this embodiment is completed. FIG. 3F shows the planar structure of FIG. 3E.

In accordance with the process in this embodiment, a wiring structure in which the gate electrode of the Poly-Si film and the wiring electrode of the silicide film are connected with each other in a self-aligned manner without using a contact through-hole can be simply provided. Further, the following advantages are provided for the display device using thin film transistors. Namely, the unnecessity of the contact through-hole permits the numerical aperture of pixels to be improved and also the siliciding of the wiring permits the wiring resistance to be decreased.

Embodiment 4

Figure 4A:
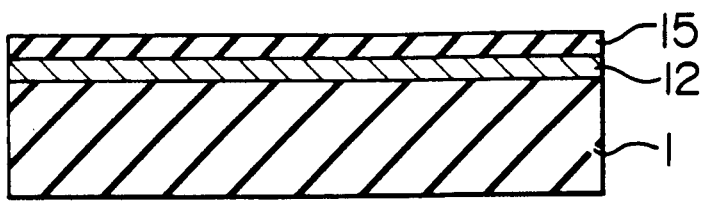
FIGS. 4A to 4F are sectional views showing the process for fabricating an active matrix substrate in accordance with a fourth embodiment of the present invention.
Figure 4B:
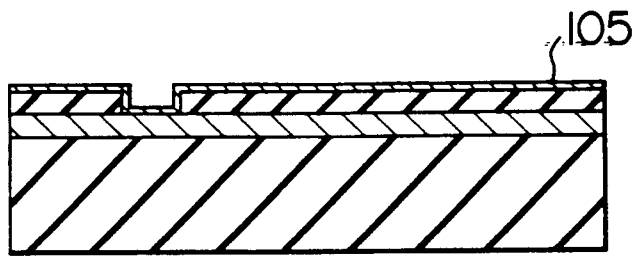
Figure 4C:
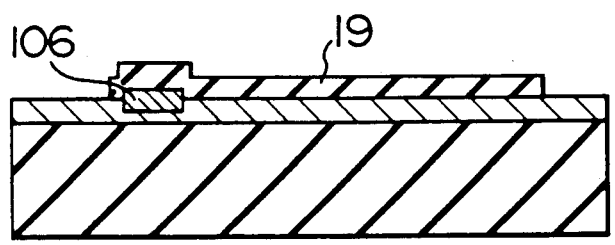
Figure 4D:
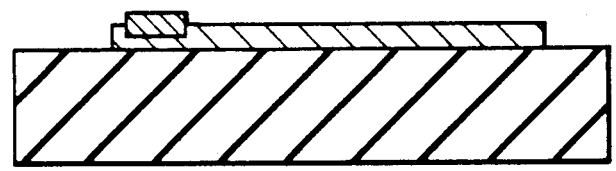
Figure 4E:
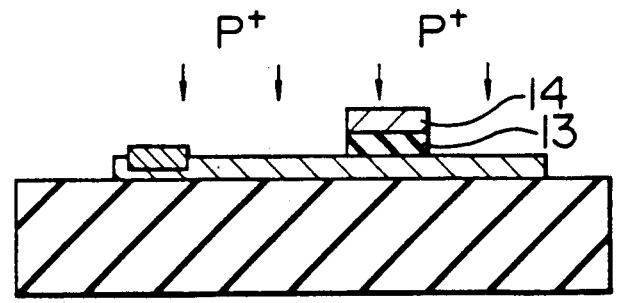
Figure 4F:
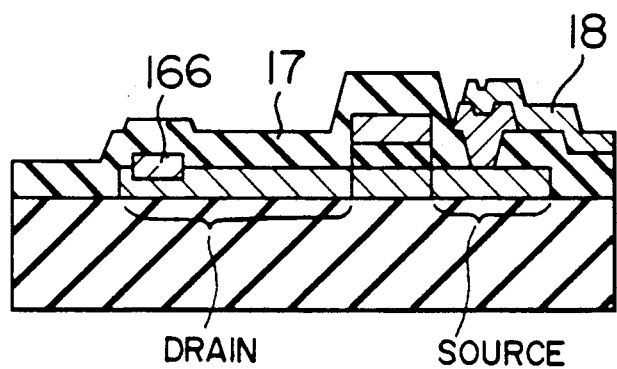
Figure 4G:
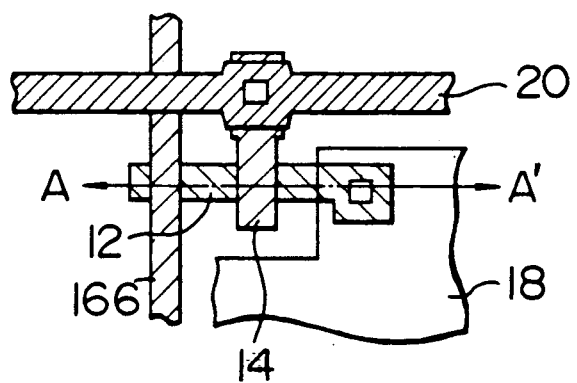
FIG. 4G is a plan view of the plan of the planar pattern of FIG. 4F.

Successively deposited on an insulating substrate 1 are a Poly-Si film 12 serving as an active layer by LPCVD and an SiO2 film 15 serving as a mask by APCVD (FIG. 4A). A part of the mask SiO2 film 15 is removed by the normal photo-etching process, and subsequently a Pt film 105 is deposited on the entire surface by sputtering (FIG. 4B). The structure is heat-treated for thirty minutes at 480° C. in an O2 ambient thereby to form a silicide film 106 on only the Poly-Si film surface at the area with the mask SiO2 film removed. The mask SiO2 film 15 is etched away, and a photoresist 19 is formed through the normal photo etching process on a part of the Poly-Si film 12 which is to be a device region of the TFT (FIG. 4C). Using as a mask the selectively formed silicide film 106 and the photoresist 19, the active layer Poly-Si film 12 is patterned by dry etching using CF4 gas (FIG. 4D). A gate SiO2 film 13 and a gate Poly-Si film 14 are successively deposited by APCVD and LPCVD, respectively, and patterned by the photo etching. P+ions are implanted by ion implantation and the structure is heat-treated for one hour at 600° C. (FIG. 4E). The deposition of an interlayer insulating film and following steps are the same as in Embodiment 3. Thus, the active matrix substrate the section of which is shown in FIG. 4F is completed. FIG. 4G shows the planar structure of FIG. 4F.

In accordance with this embodiment, as in Embodiment 1, extension of the silicide film to the side wall of the Poly-Si film can be decreased and the contact through-hole between the drain electrode of the TFT and the wiring electrode 166 can be done without, so that an active matrix substrate with a high numerical aperture of pixels can be fabricated through a simple process.

Although in the above four embodiments of the present invention, Pt silicide which Can be formed at comparatively low temperatures was used as a silicide film, any other suitable silicides of metal may be used as long as the metal directly reacts with Si to form silicide which can be selectively etched. Examples of the metal are Ni, Pd, and Co.

In the above embodiments, the mask of the SiO2 film was used to selectively form the silicide layer on the Poly-Si film. However, a maskless siliciding process by direct drawing may be adopted; in this process a laser light beam or electron beam is radiated to a stacked film of the metal and the Poly-Si film to silicide only the area irradiated with the beam.

Figure 5:
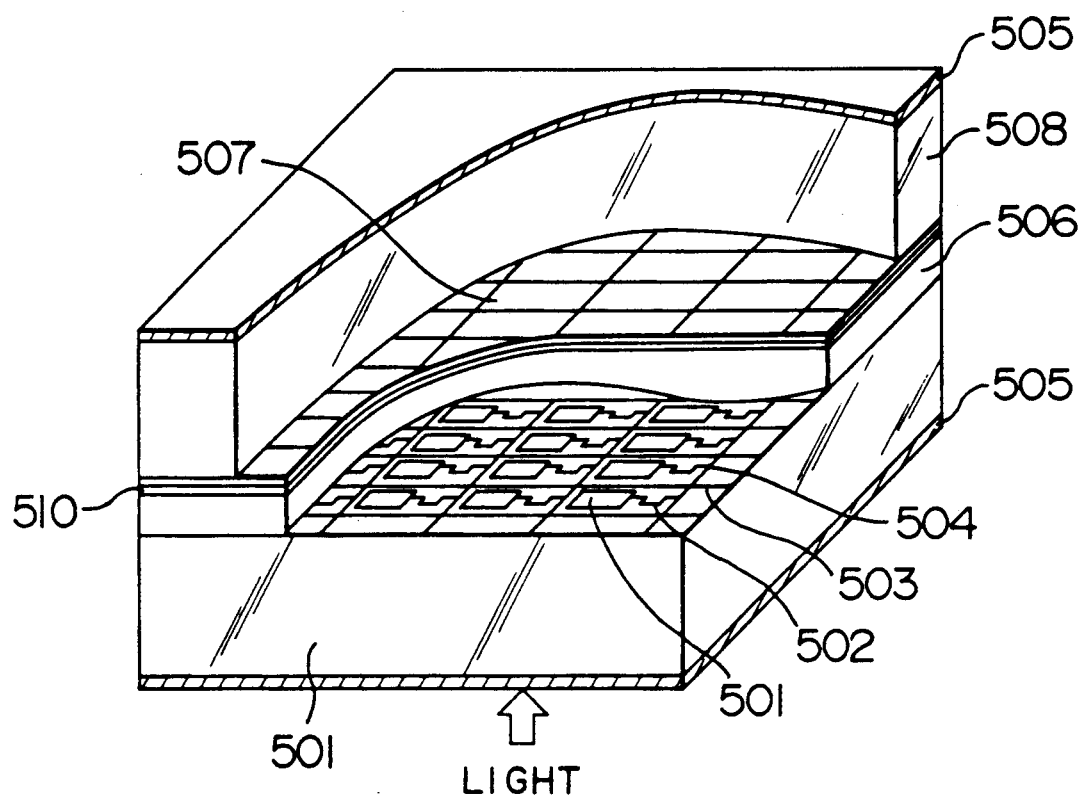
FIG. 5 is a perspective view showing the structure of a TFT driving type liquid crystal panel.

Furthermore, the active matrix substrate fabricated in accordance with the embodiments of the present invention is used as a display device as shown in FIG. 5. In FIG. 5, signal electrodes 504 and scanning electrodes 503 are formed in a matrix shape on a glass substrate 501; thin film transistors (TFT's) 502 are formed in the neighborhood of the crossing points of 503 and 504. The TFT's serve to drive pixel electrodes of transparent electrodes. Formed on another glass substrate 508, which is opposite to the glass substrate 501 intervening a liquid crystal layer 506 of electro-optical material, are an opposite electrodes 510 and color filters 507. A pair of polarization plates are formed on the respective outsides of the glass substrates 501 and 508. Transmission of light from a light source is adjusted at the pixel electrodes 501 to constitute a TFT driving type color liquid crystal display device.

In accordance with the present invention, a compound of refractory metal and semiconductor can be also used as an etching mask, so that a semiconductor device having TFT's with reduced alignment clearance by a self-alignment process and reduced wiring resistance can be easily fabricated. Further, the contact holes can be done without so that the display device with a high numerical aperture can be fabricated. Also, TFT's free from film can be provided.

Further, in accordance with the present invention, the photo mask can be reduced in the fabrication process.

Figure 6A:
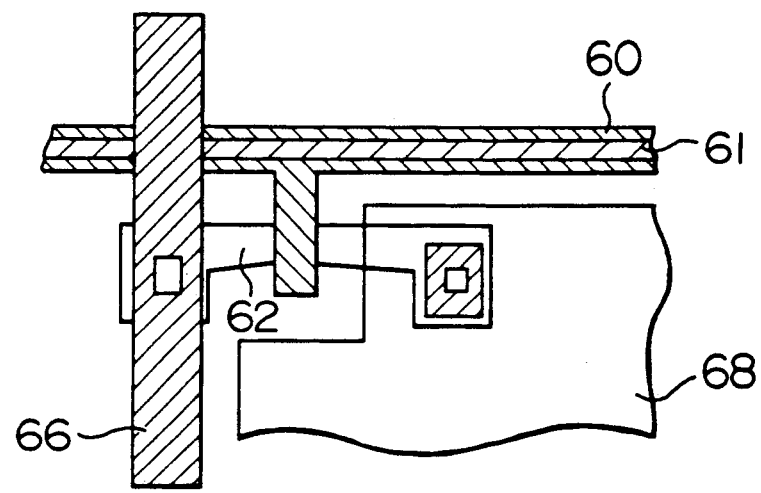
FIGS. 6A and 6B are views showing the structure of an active matrix substrate in accordance with a fifth embodiment of the present invention.
Figure 6B:
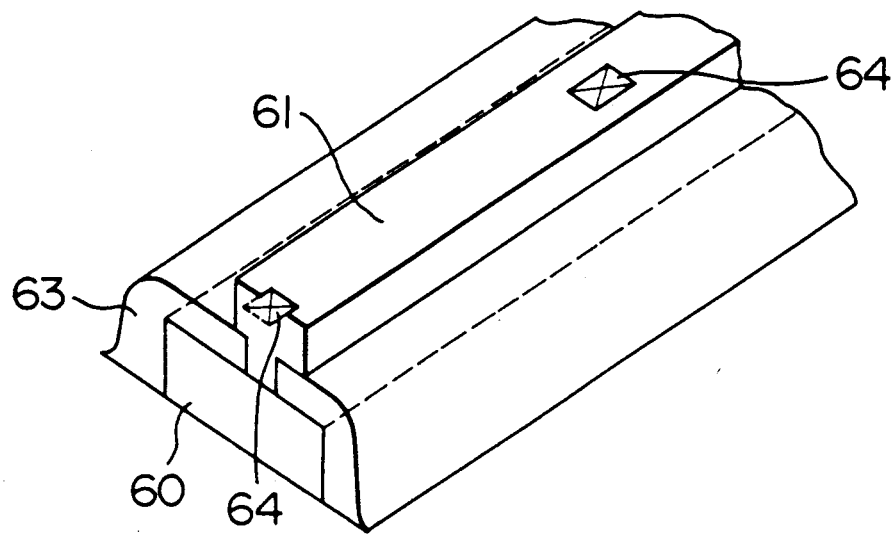

Moreover, Pt silicide has good contact characteristic for aluminum (Al) so that a partial or entire portion of the wiring can be formed as a composite film consisting of two or more layers of Al and Pt silicide, thereby permitting wiring with more reduced resistance to be realized. Such a composite layer may be commonly deposited on the part other than the gate electrode. FIG. 6A shows the planar structure of the active matrix substrate with the wiring of such a composite layer. In FIG. 6A, 68 is a pixel electrode; 62 is an active layer Poly-Si film; 66 is an Al wiring; 60 is a wiring film of Pt silicide; and 61 is an Al wiring. As shown, the Al wiring is directly laminated on the wiring film 60 except its area corresponding to the gate electrode. This laminated wiring 61, as shown in FIG. 6B, may be connected with the wiring film 60 of Pt silicide through contact holes 64 in an insulating film of e.g. $SiO_2$ made therebetween. In this case, if deposition is provided on the full surface of the Al wiring 61 after activation of the source/drain regions by implanting of impurities, the insulating film 63 protects the areas of the wiring film 60 with which the Al wiring is not required to be in contact. Conveniently, silicide such as Pt silicide is hard to disconnect or break and also can withstand high temperature as compared with Al wiring.

We claim:

1. A method of fabricating an active matrix substrate comprising the steps of:
   (a) forming an island region of a first semiconductor film on a prescribed insulating substrate;
   (b) forming a first insulating film and a second semiconductor film on said first insulating film;
   (c) forming a second insulating film on said second semiconductor film and thereafter forming a prescribed pattern of the second insulating film;
   (d) depositing prescribed metal on the pattern and thereafter forming a compound of the second semiconductor film and the metal;
   (e) removing unreacted portion of the metal and the second insulating film, and
   (f) etching said second semiconductor film and said first insulating film using said compound as a mask.

2. A method of fabricating an active matrix substrate according to claim 1, in which said second insulating film is made of $SiO_2$.

3. A method for fabricating an active matrix substrate comprising the steps of:
   (a) forming an island region of a first semiconductor film on a prescribed insulating substrate;
   (b) forming a first insulating film and a second semiconductor film on said first insulating film;
   (c) forming a second insulating film on said second semiconductor film and thereafter forming a prescribed pattern of the second insulating film;
   (d) depositing prescribed metal on the pattern and thereafter forming a compound of the second semiconductor film and the metal;
   (e) removing unreacted portion of the metal;
   (f) etching away said prescribed pattern of the second insulating film;
   (g) depositing a third insulating film on said second semiconductor film and thereafter forming a prescribed pattern thereof; and
   (h) etching said second semiconductor film and said first insulating film using said compound and said pattern of the third insulating film as a mask.

4. A method for fabricating an active matrix substrate according to claim 3, wherein said third insulating film is photoresist.

5. A method for fabricating an active matrix substrate comprising the steps of:
   (a) forming a first semiconductor film on a prescribed insulating substrate;
   (b) forming a first insulating film on said first semiconductor film and thereafter forming a prescribed pattern of the first insulating film;
   (c) depositing prescribed metal on the pattern and thereafter forming a compound of the first semiconductor film and the metal;
   (d) removing unreacted portion of the metal;
   (e) etching away the prescribed pattern of said first insulating film;
   (f) forming a second insulating film and thereafter forming a prescribed pattern thereof; and
   (g) etching said first semiconductor film using said compound and patterned second insulating film as a mask.

6. A method for fabricating an active matrix substrate according to claim 5, wherein said compound constitutes a signal electrode.

7. A method for fabricating an active matrix substrate according to claim 5, wherein said second insulating film is photoresist.

8. A method for fabricating an active matrix substrate according to claim 1, further comprising implanting impurity ions into said first semiconductor film using said compound as a mask.

9. A method for fabricating an active matrix substrate according to claim 1, wherein said compound is a silicide.

10. A method for fabricating an active matrix substrate according to claim 3, further comprising implanting impurity ions into said second semiconductor film and into said first semiconductor film using said semiconductor film as a mask.

11. A method for fabricating an active matrix substrate according to claim 3, wherein said compound is a silicide.

12. A method for fabricating an active matrix substrate according to claim 5, wherein said compound is a silicide.

13. A method for fabricating an active matrix substrate according to claim 6, further comprising forming a patterned gate insulating layer on said first semiconductor film and forming a patterned second semiconductor film on said patterned gate insulating layer.

14. A method for fabricating an active matrix substrate according to claim 13, further comprising implanting impurity ions into said second semiconductor film and into said first semiconductor film using said second semiconductor film as a mask.

* * * * *